United States Patent
Park et al.

(10) Patent No.: US 10,902,795 B2
(45) Date of Patent: Jan. 26, 2021

(54) PIXEL FOR ORGANIC LIGHT EMITTING DIODE DISPLAY AND OLED DISPLAY

(71) Applicant: LG Display Co., Ltd., Seoul (KR)

(72) Inventors: Jongmin Park, Paju-si (KR); Dongwon Park, Paju-si (KR); Yongchul Kwon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/728,648

(22) Filed: Dec. 27, 2019

(65) Prior Publication Data
US 2020/0211476 A1    Jul. 2, 2020

(30) Foreign Application Priority Data

Dec. 28, 2018 (KR) .......................... 10-2018-0171836

(51) Int. Cl.
| | |
|---|---|
| *G09G 3/3291* | (2016.01) |
| *G09G 3/3266* | (2016.01) |
| *G09G 3/3225* | (2016.01) |
| *H01L 27/32* | (2006.01) |

(52) U.S. Cl.
CPC ......... *G09G 3/3291* (2013.01); *G09G 3/3225* (2013.01); *G09G 3/3266* (2013.01); *H01L 27/3262* (2013.01); *G09G 2300/043* (2013.01); *G09G 2310/0286* (2013.01); *G09G 2310/0289* (2013.01); *G09G 2310/08* (2013.01); *G09G 2320/0233* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,978,156 | B2 | 7/2011 | Kim | |
| 2011/0115835 | A1 | 5/2011 | Lee | |
| 2016/0063921 | A1* | 3/2016 | Tsai | G09G 3/3233 |
| | | | | 345/76 |
| 2017/0032722 | A1* | 2/2017 | Wang | G09G 3/006 |
| 2017/0358641 | A1* | 12/2017 | Park | H01L 51/0097 |
| 2019/0057646 | A1* | 2/2019 | Lin | G09G 3/3233 |

FOREIGN PATENT DOCUMENTS

| | | |
|---|---|---|
| KR | 10-0624137 B1 | 9/2006 |
| KR | 10-2011-0054767 A | 5/2011 |

* cited by examiner

*Primary Examiner* — Robin J Mishler
(74) *Attorney, Agent, or Firm* — Birch, Stewart, Kolasch & Birch, LLP (57) ABSTRACT

A pixel for an organic light emitting diode (OLED) display and an OLED display are discussed. The pixel includes a driving transistor, a first transistor, a scan transistor, a first emission control transistor, and an initialization control transistor. The driving transistor includes a gate electrode connected to a first node, a drain electrode connected to a second node, and a source electrode connected to a third node. The first transistor is connected between the first node and the second node. The scan transistor is connected between the third node and a data line. The first emission control transistor is connected between the second node and an anode electrode of an organic light emitting diode. The initialization control transistor is connected between an input terminal of an initialization voltage and the anode electrode of the organic light emitting diode.

9 Claims, 13 Drawing Sheets

PIXEL FOR ORGANIC LIGHT EMITTING DIODE DISPLAY AND OLED DISPLAY

CROSS-REFERENCE TO RELATED APPLICATION

This application claims the priority benefit of the Korean Patent Application No. 10-2018-0171836 filed on Dec. 28, 2018, the entire contents of which is incorporated herein by reference for all purposes as if fully set forth herein.

BACKGROUND OF THE INVENTION

Technical Field

The present disclosure relates to a pixel for an organic light emitting diode (OLED) display and an OLED display.

Related Art

Flat panel displays (FPDs) have been widely used in a monitor of a mobile computer, such as a notebook computer and a tablet PC, and a mobile phone as well as a monitor of a desktop computer due to the characteristics advantageous for small-sized and light devices. Examples of the flat panel display include a liquid crystal display (LCD), a plasma display panel (PDP), a field emission display (FED), and an organic light emitting diode (OLED) display.

Among the flat panel displays, the OLED display has advantages of a fast response time, a wide viewing angle, and the representation of luminance with high emission efficiency. Generally, the OLED display uses a transistor, which is turned on by a scan signal, to apply a data voltage to a gate electrode of a driving transistor, and charges a storage capacitor with the data voltage supplied to the driving transistor. In addition, the OLED display allows an organic light emitting diode to emit light by outputting the data voltage charged in the storage capacitor using an emission control signal.

Driving transistors disposed in all pixels should have the same electrical characteristics, but their electrical characteristics are not uniform due to the process conditions or a driving environment, etc. For that reason, a driving current based on the same data voltage is different for each pixel, and as a result, there is a luminance difference between pixels. In order to solve this, an image quality compensation technology is known to reduce the luminance non-uniformity by sensing characteristic parameters (e.g., threshold voltage, mobility) of a driving transistor for each pixel and properly correcting input data according to a sensing result. An internal compensation method of the image quality compensation technology controls a pixel structure and a driving timing so that electrical characteristics of the driving transistor are excluded while an organic light emitting diode emits light. The internal compensation method basically performs a sampling operation of increasing a gate voltage of the driving transistor in a source follower scheme to saturate the gate voltage at a predetermined level.

The internal compensation method has a pixel structure including a plurality of transistors, and respective pixels operate in response to gate signals.

There is a need to reduce the number of transistors of an internal compensation circuit in order to improve an aperture ratio and simplify the pixel structure. Further, various methods have been continuously sought to improve the drive reliability of the internal compensation circuit.

SUMMARY OF THE INVENTION

The present disclosure provides a pixel for an organic light emitting diode (OLED) display and an OLED display including a pixel circuit capable of simplifying a pixel structure and increasing driving reliability.

One general aspect of the present disclosure includes a pixel for an OLED display including a driving transistor, a first transistor, a scan transistor, a first emission control transistor, and an initialization control transistor. The driving transistor includes a gate electrode connected to a first node, a drain electrode connected to a second node, and a source electrode connected to a third node. The first transistor is connected between the first node and the second node. The scan transistor is connected between the third node and a data line. The first emission control transistor is connected between the second node and an anode electrode of an organic light emitting diode. The initialization control transistor is connected between an input terminal of an initialization voltage and the anode electrode of the organic light emitting diode.

Another general aspect of the present disclosure includes an OLED display including a display panel including a plurality of pixels; a timing controller configured to generate a data control signal and a gate control signal based on timing signals; a data driver configured to generate a data voltage based on image data and the data control signal received from the timing controller and supply the data voltage to the display panel; and a gate driver including a level shifter and a shift register, the level shifter configured to generate a gate clock based on the gate control signal received from the timing controller, and the shift register configured to generate a gate signal based on the gate clock from the level shifter and output the gate signal to the display panel.

BRIEF DESCRIPTION OF THE DRAWINGS

The accompanying drawings, that can be included to provide a further understanding of the disclosure and are incorporated in and constitute a part of this specification, illustrate embodiments of the disclosure and together with the description serve to explain various principles of the disclosure.

DETAILED DESCRIPTION OF THE EMBODIMENTS

Reference will now be made in detail to embodiments of the disclosure, examples of which are illustrated in the accompanying drawings. Wherever possible, the same reference numbers will be used throughout the drawings to refer to the same or like parts. Detailed descriptions of known arts will be omitted if such can mislead the embodiments of the disclosure.

In a gate driver according to the present disclosure, switch elements can be implemented as transistors of n-type or p-type metal oxide semiconductor field effect transistor (MOSFET) structure. Embodiments of the present disclosure describe p-type transistors as an example, but are not limited thereto and can use different types of transistors. A transistor is a three-electrode element including a gate, a source, and a drain. The source is an electrode for supplying carriers to the transistor. The carriers within the transistor begin to flow from the source. The drain is an electrode that allows that carriers within the transistor to exit to the outside. For example, carriers in the MOSFET flow from the source to the drain. In case of an n-type MOSFET (NMOS), because carriers are electrons, a source voltage is less than a drain voltage so that electrons can flow from a source to a drain. In the n-type MOSFET, because electrons flow from the source to the drain, a current flows from the drain to the source. In case of a p-type MOSFET (PMOS), because carriers are holes, a source voltage is greater than a drain voltage so that the holes can flow from a source to a drain. In the p-type MOSFET, because the holes flow from the source to the drain, a current flows from the source to the drain. It should be noted that the source and drain of the MOSFET are not fixed. For example, the source and drain of the MOSFET can be changed depending on an applied voltage. Thus, embodiments of the present disclosure should not be limited due to the source and the drain of the transistor.

Figure 1:
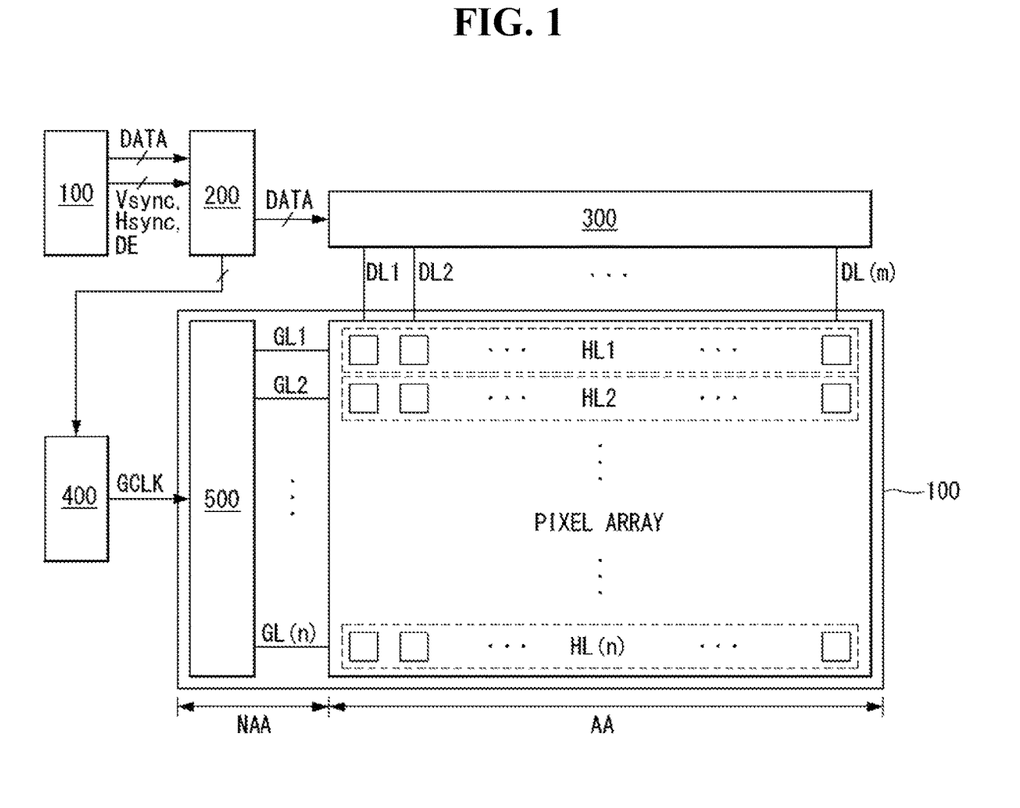
FIG. 1 illustrates configuration of an organic light emitting diode (OLED) display according to the present disclosure.

FIG. 1 illustrates an organic light emitting diode (OLED) display according to one or more embodiments of the present disclosure. All the components of the OLED display according to all embodiments of the present disclosure are operatively coupled and configured.

Referring to FIG. 1, an OLED display according to the present disclosure includes a display panel 100, a data driver 300, gate drivers, and a timing controller 200, where the gate drivers include a level shifter 400 and a shift register 500.

A plurality of data lines DL1 to DL(m) and a plurality of gate lines GL1 to GL(n) are disposed in a display area AA of the display panel 100, and pixels P for an image display are disposed at the intersections of the gate and data lines.

Each of the gate lines GL1 to GL(n) can include a scan line, an emission line, etc., and can vary according to implementation examples of the pixel P.

The timing controller 200 generates a data control signal and a gate control signal based on timing signals provided from a host 100, such as a vertical sync signal Vsync, a horizontal sync signal Hsync, and a data enable signal DE. The data control signal controls operation timing of the data driver 300, and the gate control signal controls operation timing of the gate drivers.

The data driver 300 generates a data voltage based on the data control signal and image data provided from the timing controller 200 and supplies the data voltage to the data lines DL.

The gate drivers include the level shifter 400 and the shift register 500. The level shifter 400 generates a gate clock GCLK based on the gate control signal provided from the timing controller 200. The shift register 500 generates a gate signal based on a gate clock GCLK output by the level shifter 400 and outputs the gate signal to the gate lines GL. To this end, the shift register 500 includes shift registers that are connected to each other in cascade. The shift register 500 can be directly formed on a non-display area NAA of the display panel 100 according to a gate-driver In panel (GIP) method.

Figure 2:
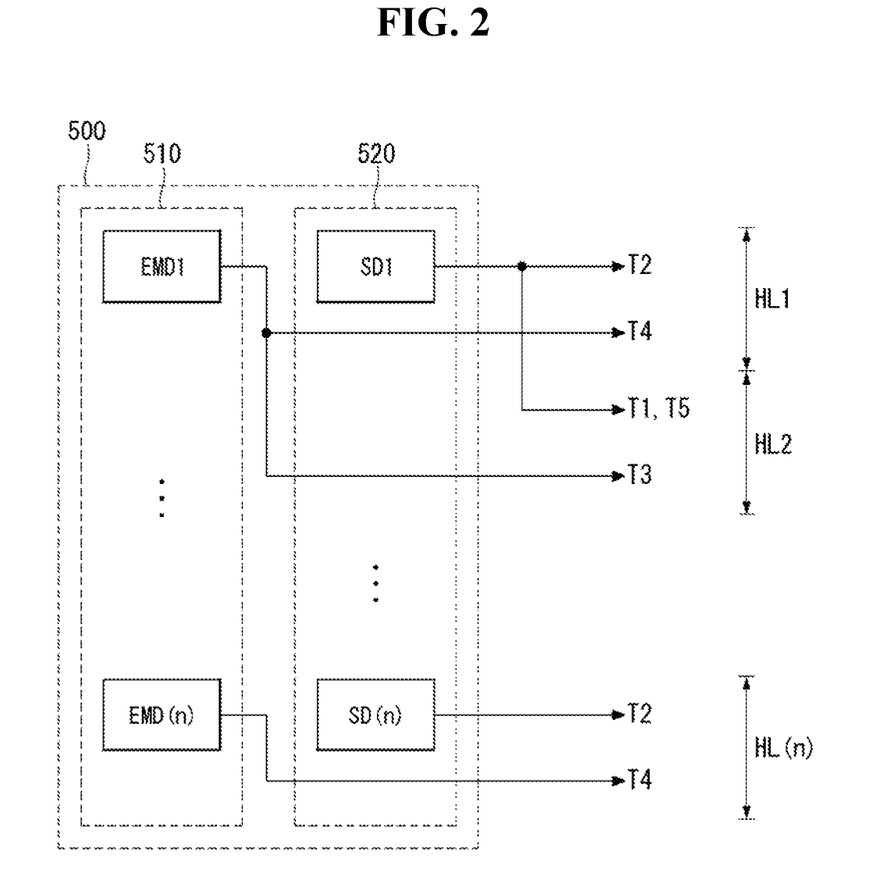
FIG. 2 illustrates a configuration of a shift register according to a first embodiment of the present disclosure.
Figure 3:
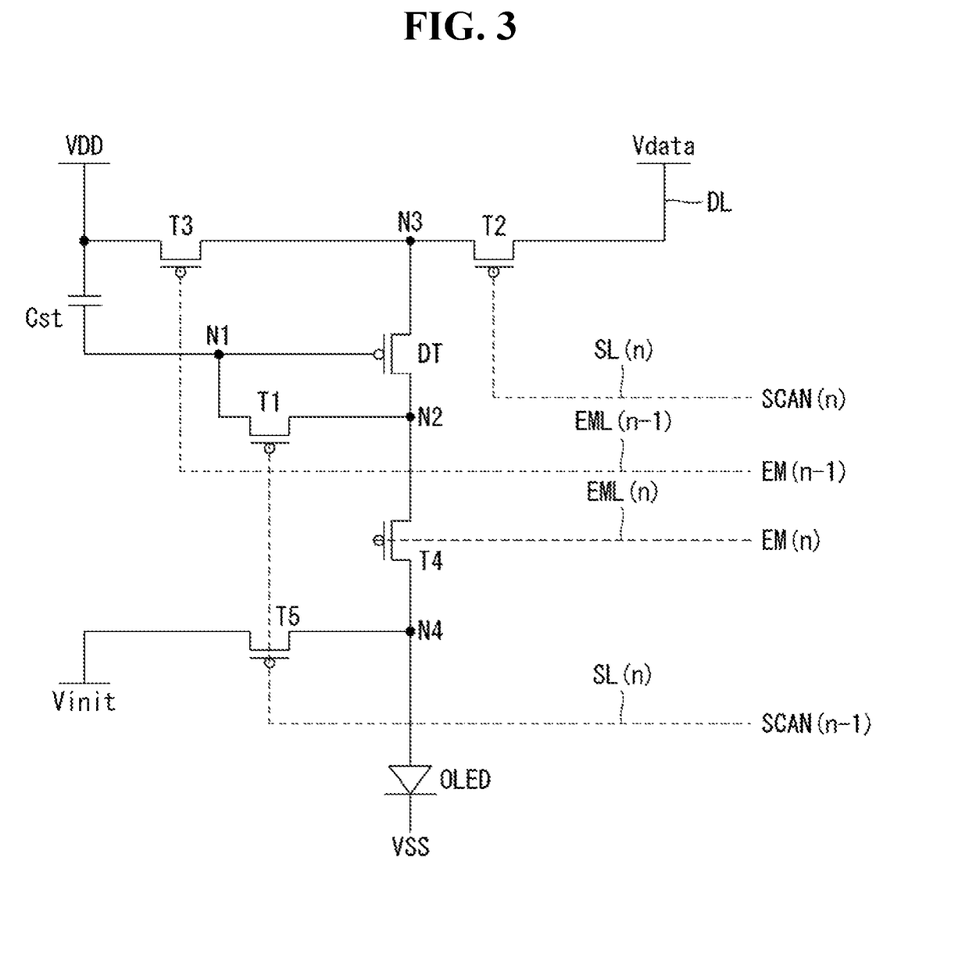
FIG. 3 illustrates a pixel structure according to the first embodiment of the present disclosure.

FIG. 2 illustrates a shift register according to a first embodiment of the present disclosure. FIG. 3 illustrates a pixel structure according to the first embodiment, where the pixel structure of FIG. 3 can be used in the OLED display of FIG. 1.

Referring to FIGS. 2 and 3, the shift register 500 according to the first embodiment includes an emission signal generator 510 and a scan signal generator 520. First to n-th emission drivers EMD1 to EMD(n) of the emission signal generator 510 are connected to each other in cascade, and first to n-th scan drivers SD1 to SD(n) of the scan signal generator 520 are connected to each other in cascade.

The emission signal generator 510 includes the first to n-th emission drivers EMD1 to EMD(n). The first emission driver EMD1 generates an emission signal EM1 and applies the emission signal EM1 to a first emission control transistor T4 of a first pixel line HL1 and a second emission control transistor T3 of a second pixel line HL2. The n-th emission driver EMD(n) generates an emission signal EM(n) and applies the emission signal EM(n) to a first emission control transistor T4 of an n-th pixel line HL(n).

The scan signal generator 520 includes the first to n-th scan drivers SD1 to SD(n). The first scan driver SD1 generates a first scan signal SCAN1 and applies the first scan signal SCAN1 to a scan transistor T2 of the first pixel line HL1 and a first transistor T1 and a fifth transistor T5 of the second pixel line HL2. The n-th scan driver SD(n) generates an n-th scan signal SCAN(n) and applies the n-th scan signal SCAN(n) to a scan transistor T2 of the n-th pixel line HL(n).

With reference to FIG. 3, a detailed configuration of a pixel disposed on the n-th pixel line is described as follows. Each pixel P of FIG. 1 can have the pixel configuration shown in FIG. 3.

As shown in FIG. 3, the pixel (e.g., P) according to the first embodiment includes an organic light emitting diode OLED, a driving transistor DT, first transistors T1, a scan transistor (hereinafter referred to as a second transistor) T2, a first emission control transistor (hereinafter referred to as a fourth transistor) T4, a second emission control transistor (hereinafter referred to as a third transistor) T3, an initialization control transistor (hereinafter referred to as a fifth transistor) T5, and a storage capacitor Cst.

The organic light emitting diode OLED emits light by a driving current supplied from the driving transistor DT. An anode electrode of the organic light emitting diode OLED is connected to a fourth node N4, and a cathode electrode thereof is connected to an input terminal of a low potential driving voltage VSS.

The driving transistor DT controls a driving current applied to the organic light emitting diode OLED depending on a source-to-gate voltage Vsg of the driving transistor DT. A gate electrode of the driving transistor DT is connected to a first node N1, a source electrode thereof is connected to a third node N3, and a drain electrode thereof is connected to a second node N2.

The first transistor T1 includes a gate electrode connected to an (n-1)th scan line SL(n-1), a drain electrode connected to the first node N1, and a source electrode connected to the second node N2. The first transistor T1 diode-connects the first node N1 to the second node N2 in response to an (n-1)th scan signal SCAN(n-1).

The second transistor T2 includes a gate electrode connected to an n-th scan line SL(n), a source electrode connected to the data line DL, and a drain electrode connected to the third node N3. The second transistor T2 writes a data voltage Vdata from the data line DL to the third node N3 in response to an n-th scan signal SCAN(n).

The third transistor T3 includes a gate electrode connected to an (n-1)th emission line EML(n-1), a source electrode connected to an input terminal of a high potential driving voltage VDD, and a drain electrode connected to the third node N3. The third transistor T3 provides the high potential driving voltage VDD to the third node N3 in response to an (n-1)th emission signal EM(n-1).

The fourth transistor T4 includes a gate electrode connected to an n-th emission line EML(n), a source electrode connected to the third node N3, and a drain electrode connected to the fourth node N4. The fourth transistor T4 connects the third node N3 to the fourth node N4 in response to an n-th emission signal EM(n).

The fifth transistor T5 includes a gate electrode connected to the (n-1)th scan signal SCAN(n-1), a source electrode connected to the fourth node N4, and a drain electrode connected to an input terminal of an initialization voltage Vinit. The fifth transistor T5 writes the initialization voltage Vinit to the fourth node N4 in response to the (n-1)th scan signal SCAN(n-1).

The storage capacitor Cst is connected between the first node N1 and the input terminal of the high potential driving voltage VDD.

Figure 4:
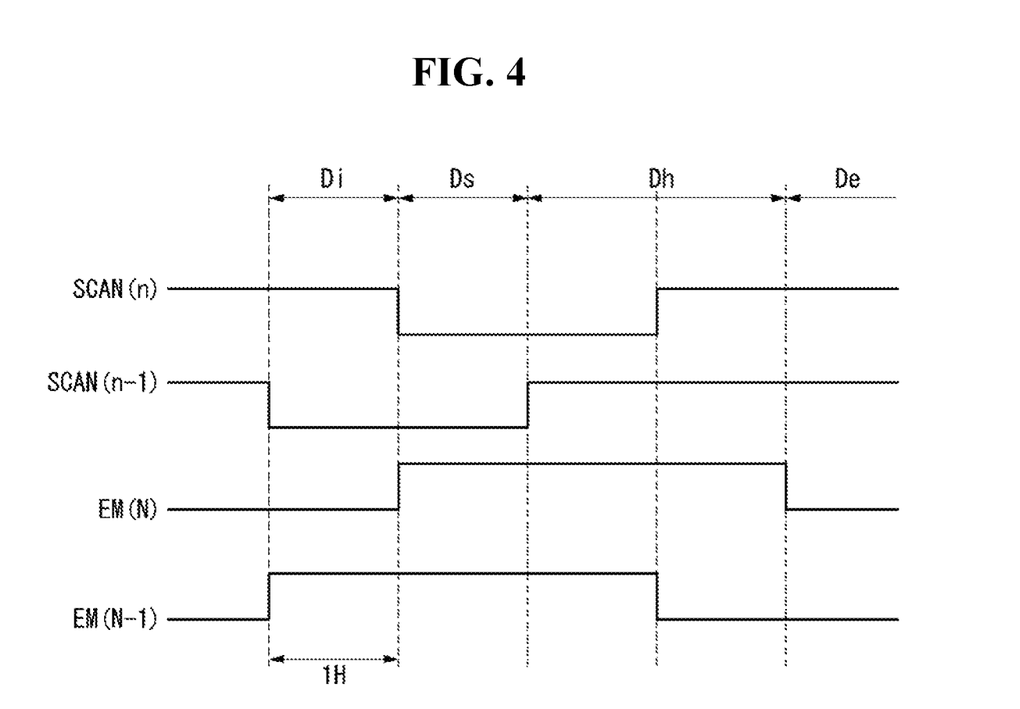
FIG. 4 illustrates timing of driving signals according to the first embodiment.
Figure 5:
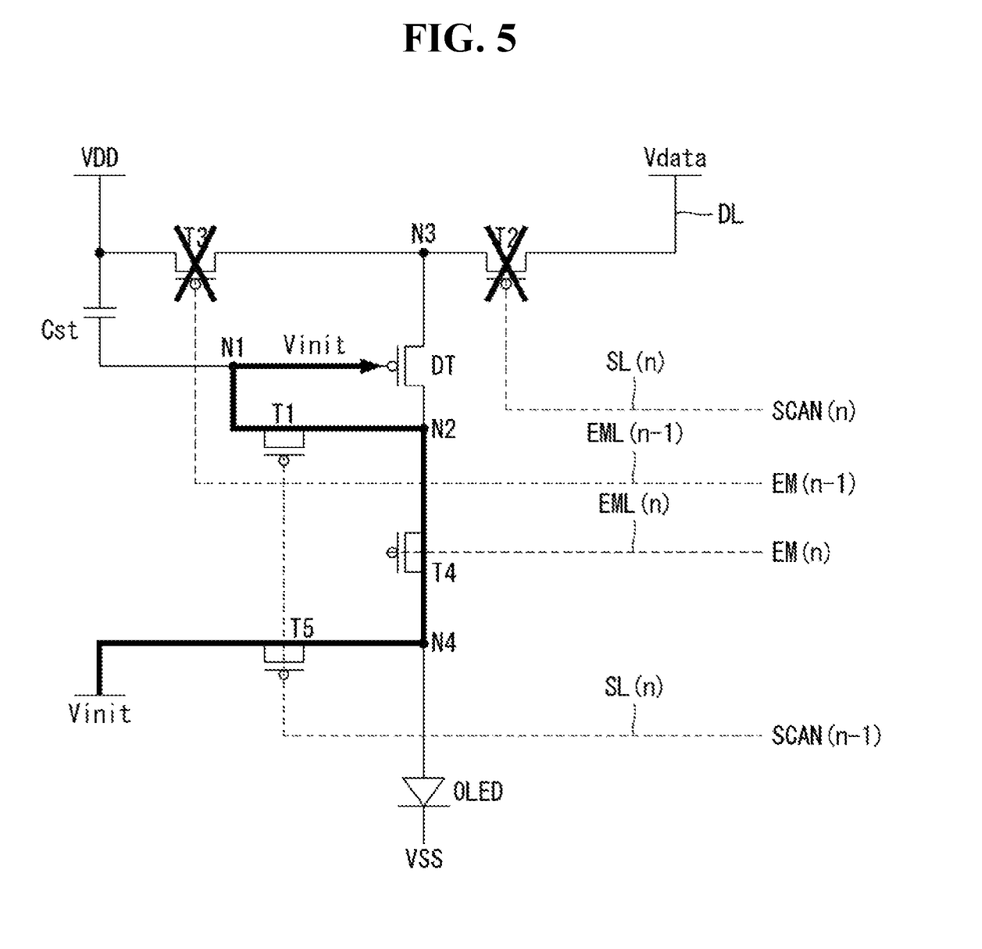
FIGS. 5 to 7 illustrate a drive of pixels according to the first embodiment.
Figure 6:
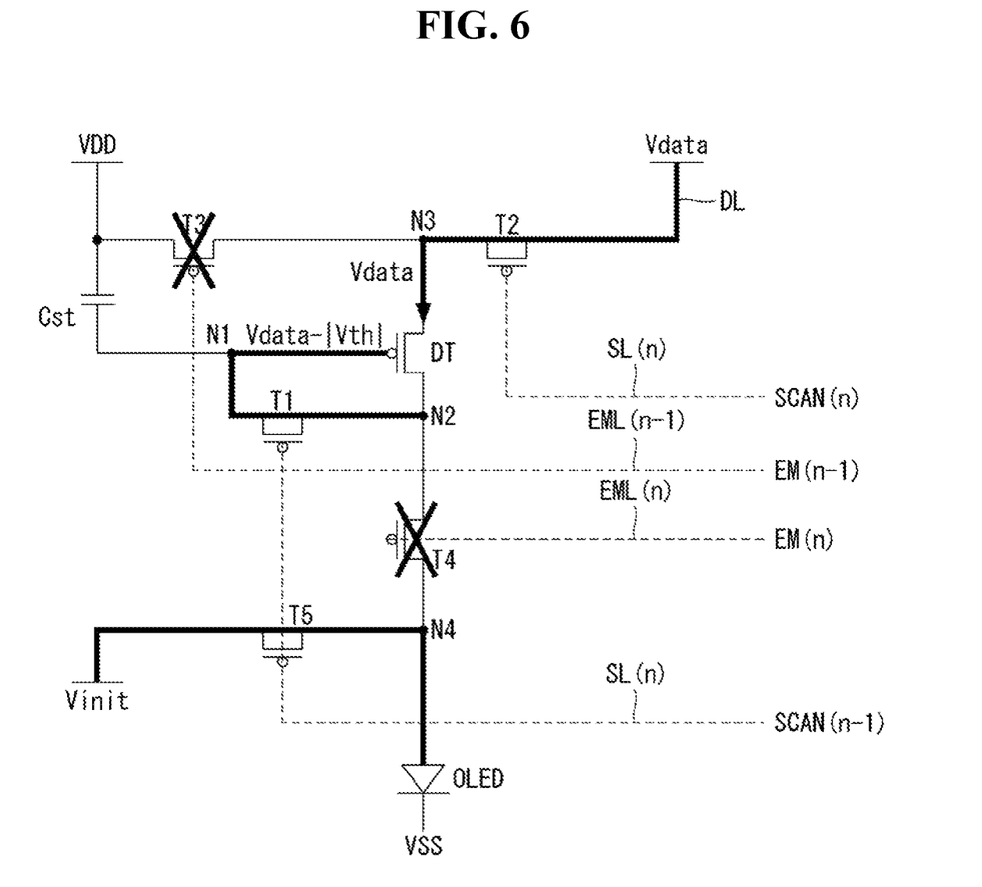
Figure 7:
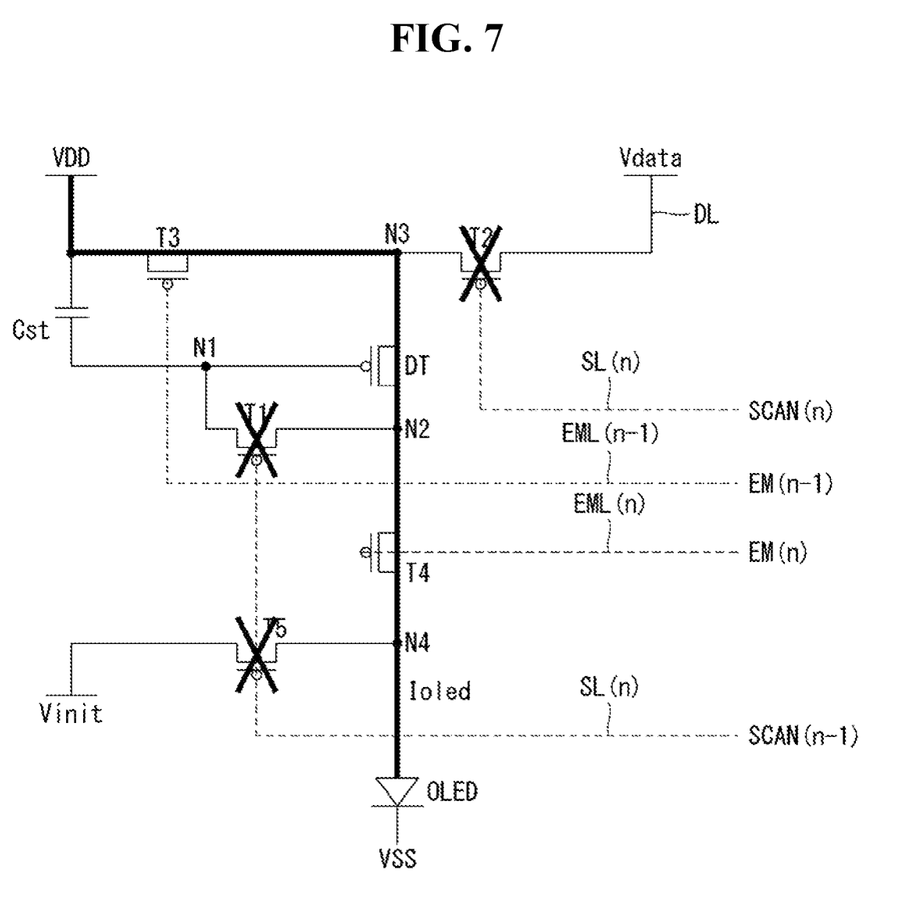

FIG. 4 illustrates timing of driving signals according to the first embodiment. FIGS. 5 to 7 illustrate an operation of a pixel depending on a drive timing according to the first embodiment. The operations of FIGS. 4-7 can be applied to the OLED display of FIG. 1.

Referring to FIGS. 4 and 5, in an initialization period D1, the (n-1)th scan signal SCAN(n-1) and the n-th emission signal EM(n) are applied as a turn-on voltage, and the n-th scan signal SCAN(n) and the (n-1)th emission signal EM(n-1) are applied as a turn-off voltage.

As a result, the first transistor T1, the fourth transistor T4, and the fifth transistor T5 are turned on, and the first node N1 is initialized to an initialization voltage Vinit.

Referring to FIGS. 4 and 6, in a sampling period Ds, the n-th scan signal SCAN(n) and the (n-1)th scan signal SCAN(n-1) are applied as a turn-on voltage, and the (n-1)th emission signal EM(n-1) and the n-th emission signal EM(n) are applied as a turn-off voltage.

The second transistor T2 writes the data voltage Vdata from the data line DL to the third node N3 in response to the n-th scan signal SCAN(n). The first transistor T1 is turned on in response to the (n-1)th scan signal SCAN(n-1) to diode-connect the first node N1 to the second node N2.

In the sampling period Ds, the fourth transistor T4 is turned off, and thus the second node N2 becomes a floating state. A voltage of the second node N2 increase by a current flowing from the third node N3 to the second node N2, and thus a voltage of the first node N1 also increases. As the voltage of the first node N1 increases, the source-to-gate voltage Vsg of the driving transistor DT decreases. In the sampling period Ds, the current flowing from the third node N3 to the second node N2 flows until the Vsg of the driving transistor DT is the same as a threshold voltage Vth of the driving transistor DT. That is, in the sampling period Ds, voltages of the first node N1 and the second node N2 are saturated to a value (Vdata-|Vth|) by subtracting an absolute value of the threshold voltage Vth from the data voltage Vdata written to the third node N3.

After the sampling period Ds, a holding period Dh for improving the drive reliability can be maintained for a predetermined period of time.

Referring to FIGS. 4 and 7, in an emission period De, the n-th emission signal EM(n) and the (n-1)th emission signal EM(n-1) are applied as a turn-on voltage, and the n-th scan signal SCAN(n) and the (n-1)th scan signal SCAN(n-1) are applied as a turn-off voltage.

The third transistor T3 and the fourth transistor T4 are turned on, and a driving current Ioled from the input terminal of the high potential driving voltage VDD via the driving transistor DT enters an anode electrode of the organic light emitting diode OLED.

In this instance, a voltage of a source node N3 of the driving transistor DT corresponds to the high potential driving voltage VDD, and a voltage of a gate node N1 of the driving transistor DT corresponds to "Vdata-|Vth|". Thus, a relation equation for the driving current Ioled flowing in the organic light emitting diode OLED is as the following Equation 1.

$$IOLED = k/2(Vsg-|Vth|)2 = k/2\{(Vs-Vg)-|Vth|\}2 = k/2\{VDD-(Vdata-|Vth|)-|Vth|\}2 = k/2(VDD-Vdata)2 \quad \text{[Equation 1]}$$

In Equation 1, k/2 indicates a proportional constant determined by electron mobility, a parasitic capacitance, and a channel capacity, etc. of the driving transistor DT. As can be seen from Equation 1, in the relation equation of the driving current Ioled, the component of the threshold voltage Vth of the driving transistor DT is eliminated. Hence, an influence of changes in the threshold voltage Vth on the driving transistor DT is removed.

The display device according to the present disclosure directly writes the data voltage Vdata to the third node N3 corresponding to a source electrode of the driving transistor DT in the sampling period Ds.

Figure 8:
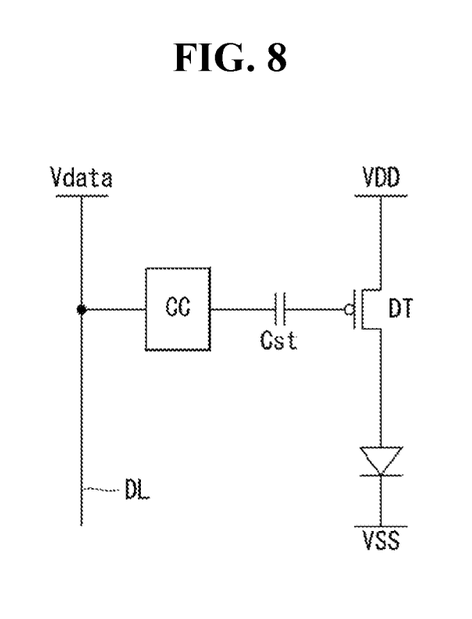
FIG. 8 schematically illustrates a pixel structure according to a comparative example.

On the contrary, FIG. 8 illustrates a pixel structure according to a comparative example. As illustrated in FIG. 8, the pixel according to the comparative example includes a capacitor Cst connected to the gate electrode of the driving transistor DT. The pixel writes a data voltage Vdata provided from a data line DL to the capacitor Cst using a compensation circuit CC. The capacitor Cst written with the data voltage Vdata can generate a coupling phenomenon with various parasitic capacitors formed in the pixel. Thus, in the comparative example, a magnitude of the data voltage Vdata written to the capacitor Cst is unstable, and hence an emission luminance of an organic light emitting diode OLED can vary.

On the other hand, the OLED display according to one or more embodiments of the present disclosure can prevent a luminance variation from occurring due to a coupling phenomenon with parasitic capacitors because the OLED display directly writes the data voltage Vdata to the source electrode of the driving transistor DT.

The OLED display according to the first embodiment can stabilize an initialization operation of the first node N1 because the OLED display separately controls the third transistor T3 and the fourth transistor T4. If the third transistor T3 and the fourth transistor T4 are controlled by the same emission signal EM(n), the input terminal of the high potential driving voltage VDD and the third node N3 are electrically connected in the initialization period D1. Thus, the high potential driving voltage VDD is applied to the third node N3, and as a result, the initialization voltage Vinit written to the first node N1 can be unstable.

However, in the first embodiment, because the third transistor T3 can be turned off in the initialization period D1, the initialization voltage Vinit can be stably written to the first node N1.

In the OLED display according to the present disclosure, the first transistor T1 is used for the diode connection in the sampling period. Further, the present disclosure writes the initialization voltage Vinit to the gate electrode of the driving transistor DT using the first transistor T1 thus formed.

An existing internal compensation circuit included a transistor for directly writing an initialization voltage Vinit to a gate electrode of a driving transistor DT. That is, the related art can include two or more transistors directly connected to the gate electrode of the driving transistor DT. As the number of transistors connected to the gate electrode of the driving transistor DT increases, a leakage current from the gate electrode of the driving transistor DT increases. In the related art, a magnitude of a source-to-gate voltage Vsg of the driving transistor DT varies, and hence can affect an emission luminance.

On the other hand, the OLED display according to the present disclosure can reduce a leakage current of the driving transistor DT because the OLED display does not include a transistor for directly writing the initialization voltage Vinit to the gate electrode of the driving transistor DT.

Figure 9:
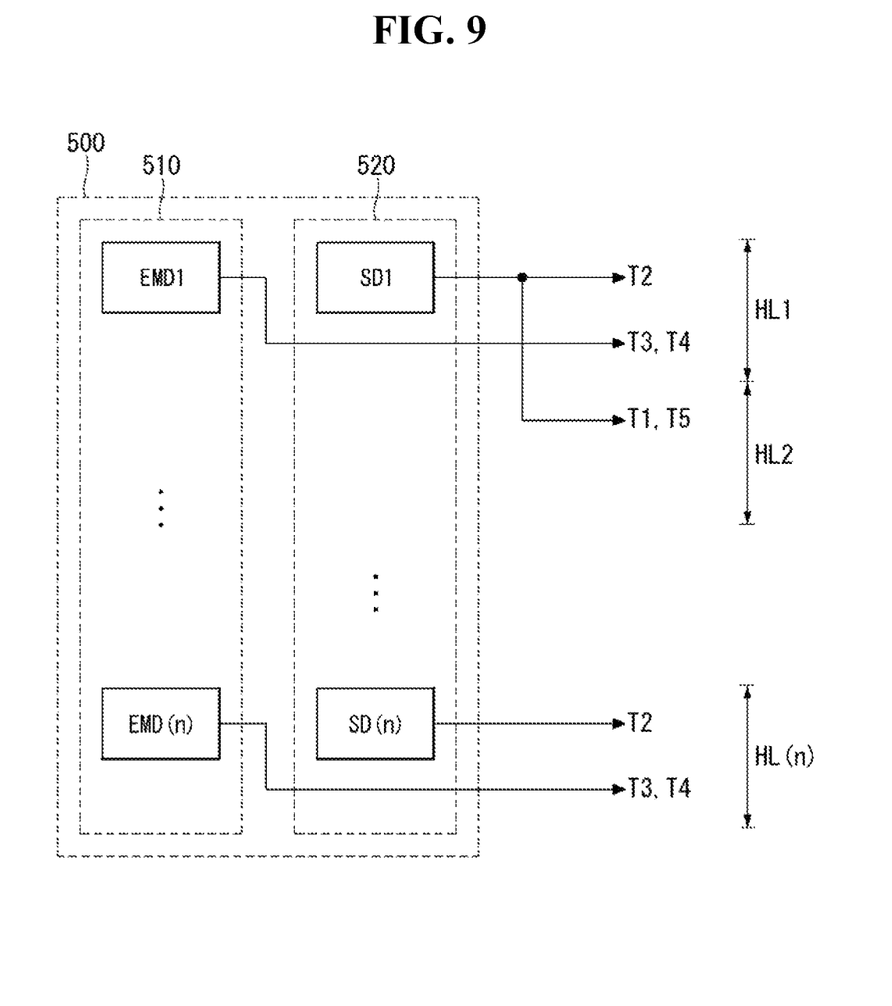
FIG. 9 illustrates configuration of a shift register according to a second embodiment of the present disclosure.

FIG. 9 illustrates a shift register according to a second embodiment of the present disclosure. The shift register of FIG. 9 can be utilized as the shift register 500 in FIG. 1.

Referring to FIG. 9, a shift register 500 according to the second embodiment includes an emission signal generator 510 and a scan signal generator 520. First to n-th emission drivers EMD1 to EMD(n) of the emission signal generator 510 are cascade-connected to each other, and first to n-th scan drivers SD1 to SD(n) of the scan signal generator 520 are cascade-connected to each other.

The emission signal generator 510 includes the first to n-th emission drivers EMD1 to EMD(n). The first emission driver EMD1 generates an emission signal EM1 and applies the emission signal EM1 to a fourth transistor T4 and a third transistor T3 of a first pixel line HL1. The n-th emission driver EMD(n) generates an emission signal EM(n) and applies the emission signal EM(n) to a fourth transistor T4 and a third transistor T3 of an n-th pixel line HL(n).

The scan signal generator 520 includes the first to n-th scan drivers SD1 to SD(n). The first scan driver SD1 generates a first scan signal SCAN1 and applies the first scan signal SCAN1 to a second transistor T2 of the first pixel line HL1 and a first transistor T1 and a fifth transistor T5 of a second pixel line HL2. The n-th scan driver SD(n) generates an n-th scan signal SCAN(n) and applies the n-th scan signal SCAN(n) to a second transistor T2 of the n-th pixel line HL(n).

Figure 10:
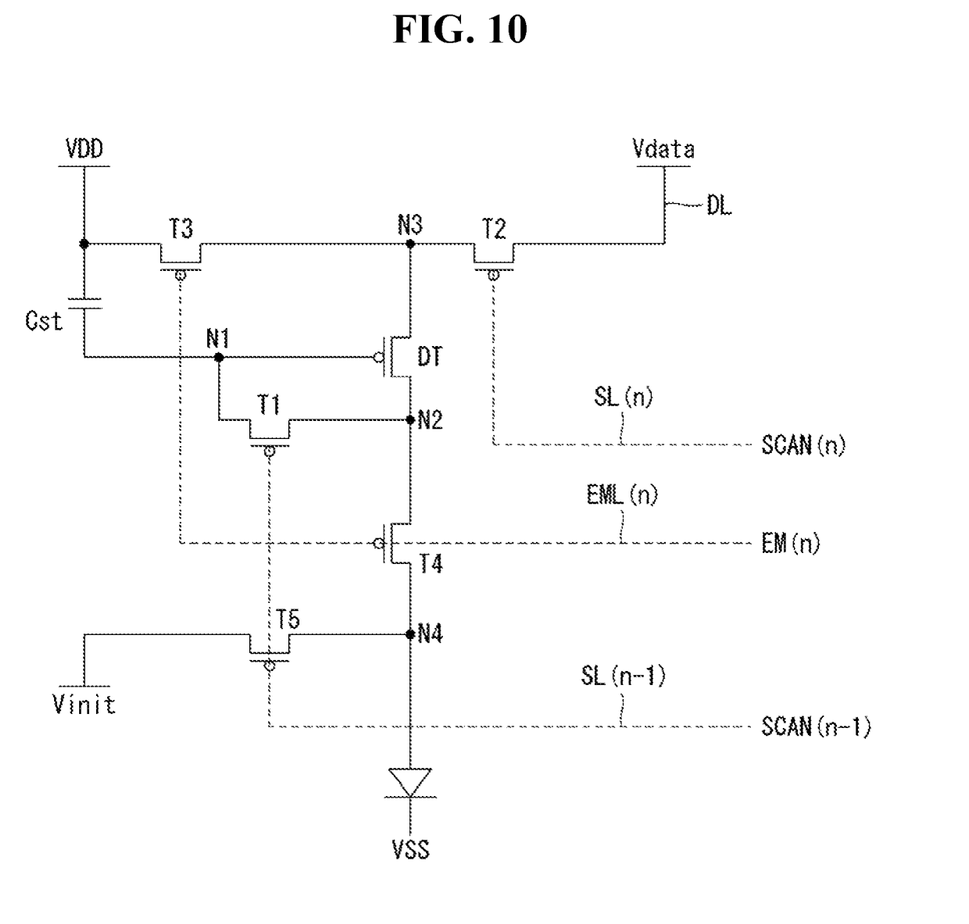
FIG. 10 illustrates a pixel structure according to the second embodiment.

FIG. 10 illustrates a pixel structure according to the second embodiment. More specifically, FIG. 10 illustrates a pixel using gate signals of the shift register illustrated in FIG. 9, and in particular, illustrates a pixel disposed on the n-th pixel line HL(n).

Referring to FIG. 10, the pixel according to the second embodiment includes an organic light emitting diode OLED, a driving transistor DT, first to fifth transistors T1 to T5, and a storage capacitor Cst. The detailed description of configuration and components illustrated in FIG. 10 that are substantially the same as those in the first embodiment is omitted or will be brief.

The third transistor T3 includes a gate electrode connected to an n-th emission line EML(n), a source electrode connected to an input terminal of a high potential driving voltage VDD, and a drain electrode connected to a third node N3. The third transistor T3 provides the high potential driving voltage VDD to the third node N3 in response to the n-th emission line EML(n).

The fourth transistor T4 includes a gate electrode connected to the n-th emission line EML(n), a source electrode connected to the third node N3, and a drain electrode connected to a fourth node N4. The fourth transistor T4 connects the third node N3 to the fourth node N4 in response to the n-th emission line EML(n).

That is, in the pixel structure according to the second embodiment, the third transistor T3 and the fourth transistor T4 are controlled by the same n-th emission line EML(n).

As illustrated in FIG. 9, the second embodiment is configured such that the first emission driver EMD1 controls operations of the third and fourth transistors T3 and T4 disposed on one pixel line. Thus, the second embodiment can further simplify an array structure of a display panel 100, as compared to the first embodiment.

In the second embodiment, timing of the emission signal output by each of the first to n-th emission drivers EMD1 to EMD(n) can be the same as that in the first embodiment. As a result, a turn-on timing of the third and fourth transistors T3 and T4 in the second embodiment is the same as a turn-on timing of the third and fourth transistors T3 and T4 in the first embodiment. Thus, the second embodiment can operate at the same timing as the first embodiment as show in FIG. 4.

Figure 11:
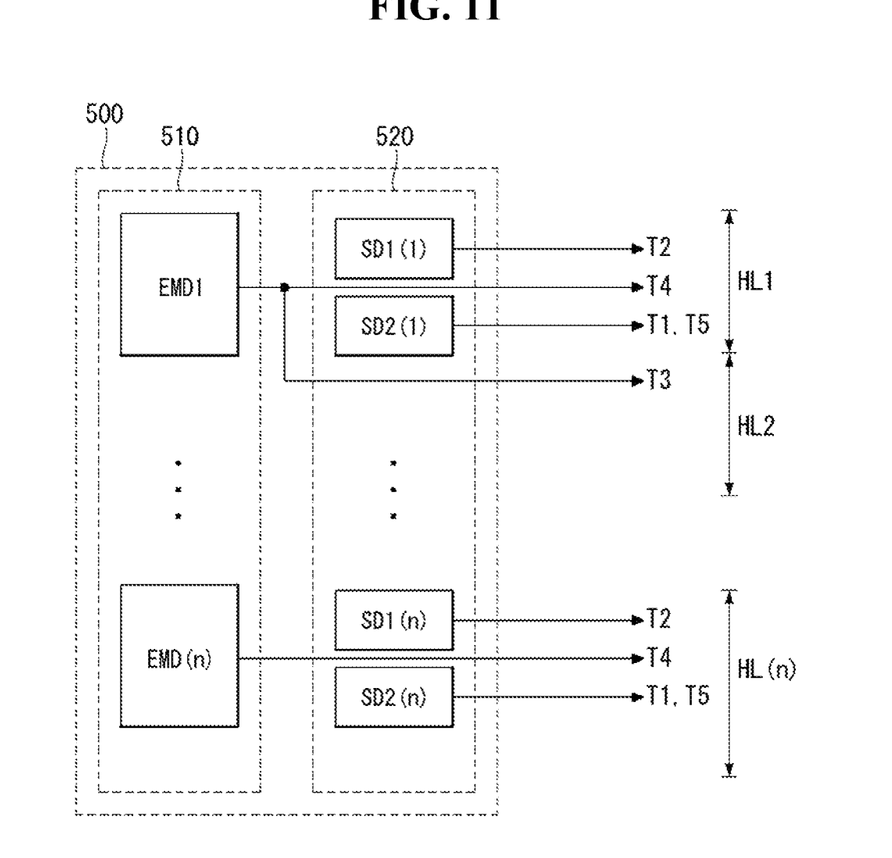
FIG. 11 illustrates configuration of a shift register according to a third embodiment of the present disclosure.

FIG. 11 illustrates a shift register according to a third embodiment of the present disclosure. The shift register of FIG. 11 can be used as the shift register 500 of FIG. 1.

Referring to FIG. 11, a shift register 500 according to the third embodiment includes an emission signal generator 510 and a scan signal generator 520.

First to n-th emission drivers EMD1 to EMD(n) of the emission signal generator 510 are cascade-connected to each other. The first emission driver EMD1 generates an emission signal EM1 and applies the emission signal EM1 to a fourth transistor T4 of a first pixel line HL1 and a third transistor T3 of a second pixel line HL2. The n-th emission driver EMD(n) generates an emission signal EM(n) and applies the emission signal EM(n) to a fourth transistor T4 of an n-th pixel line HL(n).

The scan signal generator 520 includes a scan1 generator and a scan2 generator. The scan1 generator includes first to n-th scan1 drivers SD1(1) to SD1(n) that are cascade-connected to each other, and the scan2 generator includes first to n-th scan2 drivers SD2(1) to SD2(n) that are cascade-connected to each other.

The first scan1 driver SD1(1) generates a first scan1 signal SCAN1(1) and applies the first scan1 signal SCAN1(1) to a second transistor T2 of the first pixel line HL1. The n-th scan1 driver SD1(n) generates an n-th scan1 signal SCAN1(n) and applies the n-th scan1 signal SCAN1(n) to a second transistor T2 of the n-th pixel line HL(n).

The first scan2 driver SD2(1) generates a first scan2 signal SCAN2(1) and applies the first scan2 signal SCAN2(1) to a first transistor T1 and a fifth transistor T5 of the first pixel line HL1. The n-th scan2 driver SD2(n) generates an n-th scan2 signal SCAN2(n) and applies the n-th scan2 signal SCAN2(n) to a first transistor T1 of the n-th pixel line HL(n).

Figure 12:
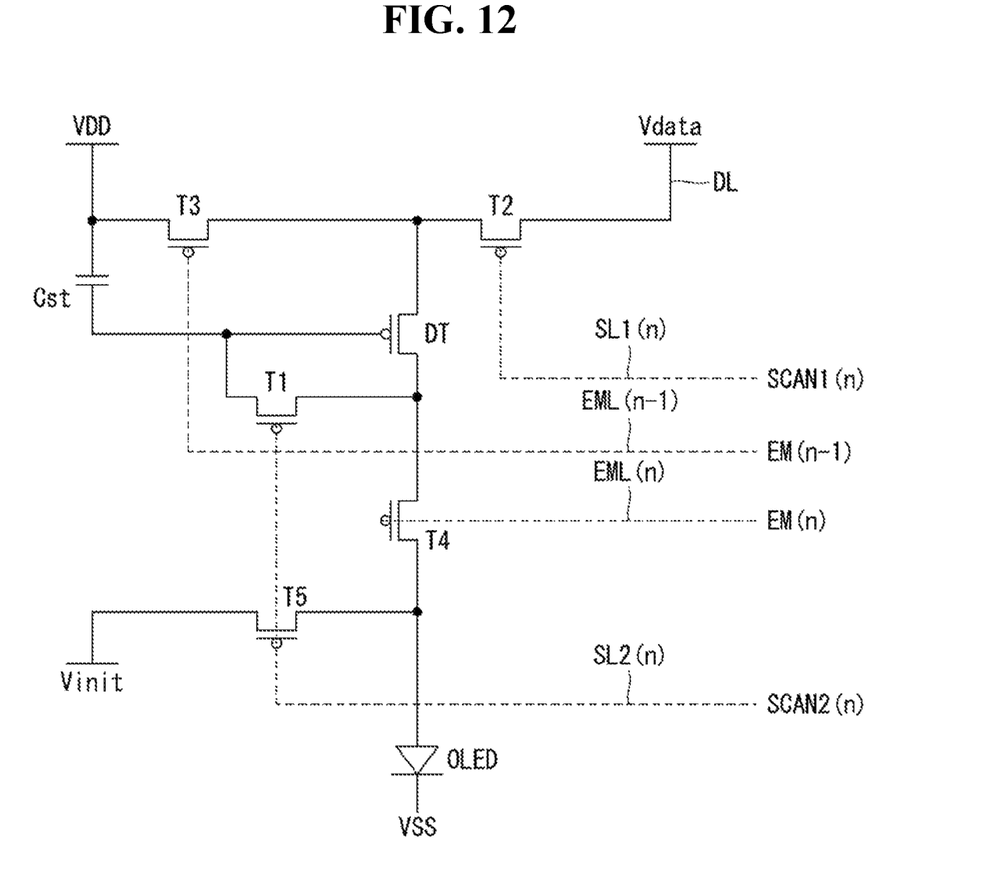
FIG. 12 illustrates a pixel structure according to the third embodiment.

FIG. 12 illustrates a pixel structure according to the third embodiment. More specifically, FIG. 12 illustrates a pixel using gate signals output by the shift register illustrated in FIG. 11, and in particular, illustrates a pixel disposed on the n-th pixel line HL(n).

Referring to FIG. 12, the pixel according to the third embodiment includes an organic light emitting diode OLED, a driving transistor DT, first to fifth transistors T1 to T5, and a storage capacitor Cst. The detailed description of configuration and components in the third embodiment that are substantially the same as those in the first embodiment is omitted or will be brief.

The first transistor T1 includes a gate electrode connected to an n-th scan2 line SL2(n), a drain electrode connected to a first node N1, and a source electrode connected to a second node N2. The first transistor T1 diode-connects the first node N1 to the second node N2 in response to an n-th scan2 signal SCAN2(n).

The second transistor T2 includes a gate electrode connected to an n-th scan1 line SL1(n), a source electrode connected to a data line DL, and a drain electrode connected to a third node N3. The second transistor T2 writes a data voltage Vdata from the data line DL to the third node N3 in response to an n-th scan1 signal SCAN1(n).

The fifth transistor T5 includes a gate electrode connected to the n-th scan2 line SL2(n), a source electrode connected to a fourth node N4, and a drain electrode connected to an input terminal of an initialization voltage Vinit. The fifth transistor T5 writes the initialization voltage Vinit to the fourth node N4 in response to the n-th scan2 signal SCAN2 (n).

Figure 13:
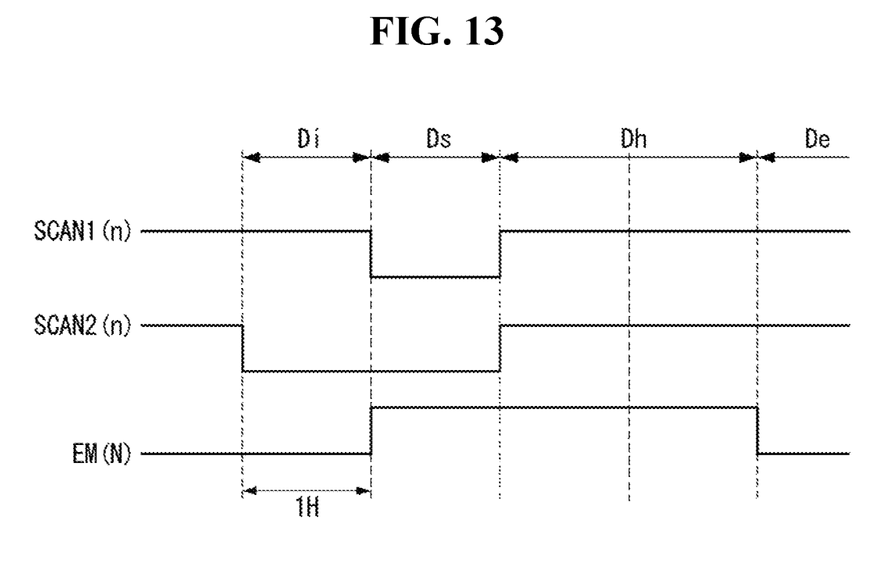
FIG. 13 illustrates an example of timing of driving signals according to the third embodiment.

FIG. 13 illustrates timing of driving signals according to the third embodiment. A drive of the pixel illustrated in FIG. 12 based on the driving signals of FIG. 13 according to the third embodiment is described as follows. The detailed description of operation in the third embodiment that is substantially the same as that in the first embodiment is omitted or briefly discussed below.

Referring to FIGS. 12 and 13, in an initialization period D1, the first transistor T1, the fourth transistor T4, and the fifth transistor T5 are turned on, and the first node N1 is initialized to the initialization voltage Vinit.

In a sampling period Ds, the second transistor T2 is turned on, and a data voltage Vdata from the data line DL is written to the third node N3. The first transistor T1 is turned on to diode-connect the first node N1 to the second node N2. During the sampling period Ds, voltages of the first node N1 and the second node N2 are saturated to a value (Vdata-|Vth|) by subtracting an absolute value of a threshold voltage Vth from the data voltage Vdata written to the third node N3.

After the sampling period Ds, a holding period Dh for improving the drive reliability can be maintained for a predetermined period of time. In the third embodiment, the second transistor T2 becomes a turn-off state during the holding period Dh. Thus, in the third embodiment, all the first to fifth transistors T1 to T5 are maintained in a turn-off state during the holding period Dh. Therefore, the third embodiment further improves the drive reliability, as compared to the first and second embodiments.

In an emission period De, the third transistor T3 and the fourth transistor T4 are turned on, and a driving current from the input terminal of the high potential driving voltage VDD via the driving transistor DT enters an anode electrode of the organic light emitting diode OLED. The organic light emitting diode OLED emits light at a brightness proportional to the driving current.

The n-th scan1 signal SCAN1(n) illustrated in FIG. 13 corresponds to a change in timing of the scan signal applied to the second transistor T2 in the pixel structure illustrated in FIG. 3. Furthermore, the n-th scan1 signal SCAN1(n) illustrated in FIG. 13 can be applied to the pixel structure illustrated in FIG. 10. That is, an embodiment can be implemented such that the n-th scan1 signal SCAN1(n) illustrated in FIG. 13 is applied to the second transistor T2 illustrated in FIG. 10, and the n-th scan2 signal SCAN2(n) illustrated in FIG. 13 is applied to the first and fifth transistors T1 and T5 illustrated in FIG. 10.

Figure 14:
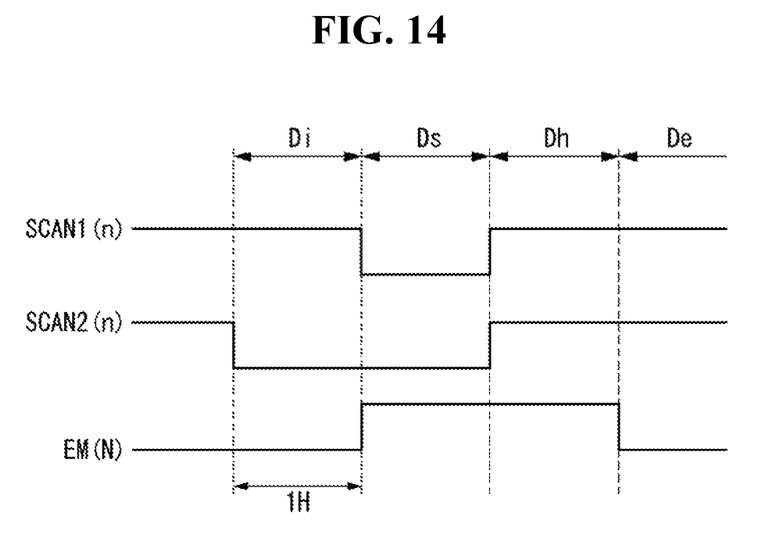
FIG. 14 illustrates another example of timing of driving signals according to the third embodiment.

The embodiments of the disclosure have been described focusing on an example where a high level period of the emission signal EM(n) is three horizontal periods 3H. Further, in respective embodiments, as illustrated in FIG. 14, the emission signal EM(n) can hold a high level period during two horizontal periods 2H and set the holding period Dh to two horizontal periods 2H.

As described above, the OLED display according to one or more embodiments of the present disclosure constitutes the internal compensation circuit using the relatively small number of transistors, and thus can simplify the pixel structure and increase an aperture ratio.

The OLED display according to one or more embodiments of the present disclosure can prevent a sampling operation resulting from the parasitic capacitors from being unstable by writing the data voltage to the source electrode of the driving transistor.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A pixel for an organic light emitting diode (OLED) display, the pixel comprising:
    an OLED;
    a driving transistor including a gate electrode connected to a first node, a drain electrode connected to a second node, and a source electrode connected to a third node;
    a first transistor connected between the first node and the second node;
    a scan transistor connected between the third node and a data line;
    a first emission control transistor connected between the second node and an anode electrode of the OLED;
    an initialization control transistor connected between an input terminal of an initialization voltage and the anode electrode of the OLED; and
    a second emission control transistor connected between an input terminal of a high potential driving voltage and the third node,
    wherein the second emission control transistor is directly connected to the third node, and wherein during an initialization period, the initialization control transistor, the first emission control transistor, and the first transistor are turned on to apply the initialization voltage to the first node.

2. The pixel of claim 1, wherein during the initialization period, the second emission control transistor maintains a turn-off state.

3. The pixel of claim 1, wherein during a sampling period, the scan transistor and the first transistor are turned on and the first emission control transistor is turned off, and the second node becomes a floating state.

4. The pixel of claim 3, wherein during the sampling period, the second emission control transistor maintains a turn-off state.

5. The pixel of claim 1, wherein during an emission period,
the first and second emission control transistors maintain a turn-on state, and
the scan transistor, the first transistor, and the initialization control transistor maintain a turn-off state.

6. The pixel of claim 1, wherein the first transistor and the initialization control transistor on an n-th pixel line are controlled by a same scan signal as the scan transistor on an (n-1)th pixel line, where n is a natural number equal to or greater than 2.

7. The pixel of claim 1, wherein the second emission control transistor on an n-th pixel line is controlled by a same emission control signal as the first emission control transistor on an (n-1)th pixel line, where n is a natural number equal to or greater than 2.

8. An organic light emitting diode (OLED) display, comprising:
a display panel including a plurality of pixels, wherein at least one of the plurality of pixels is the pixel according to claim 1;
a timing controller configured to generate a data control signal and a gate control signal based on timing signals;
a data driver configured to generate a data voltage based on image data and the data control signal received from the timing controller, and supply the data voltage to the display panel; and
a level shifter and a shift register of a gate driver,
the level shifter configured to generate a gate clock based on the gate control signal received from the timing controller, and
the shift register configured to generate a gate signal based on the gate clock from the level shifter and output the gate signal to the display panel.

9. The OLED display of claim 8, wherein the shift register includes an emission signal generator and a scan signal generator,
wherein the emission signal generator includes a plurality of emission drivers configured to generate emission signals and apply the emission signals to the display panel, and
wherein the scan signal generator includes a plurality of scan drivers configured to generate scan signals and apply the scan signals to the display panel.

* * * * *